(12) United States Patent
Boyd et al.

(10) Patent No.: US 11,127,622 B2
(45) Date of Patent: Sep. 21, 2021

(54) DEEP TRENCH ISOLATION AND SUBSTRATE CONNECTION ON SOI

(71) Applicant: NXP USA, Inc., Austin, TX (US)

(72) Inventors: James Gordon Boyd, Pflugerville, TX (US); Zhihong Zhang, Chandler, AZ (US); Ronghua Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/741,011

(22) Filed: Jan. 13, 2020

(65) Prior Publication Data
US 2021/0217655 A1  Jul. 15, 2021

(51) Int. Cl.
| H01L 21/76 | (2006.01) |
| H01L 21/762 | (2006.01) |
| H01L 21/761 | (2006.01) |
| H01L 21/8234 | (2006.01) |
| H01L 29/06 | (2006.01) |
| H01L 21/768 | (2006.01) |
| H01L 21/74 | (2006.01) |

(52) U.S. Cl.
CPC ...... *H01L 21/76229* (2013.01); *H01L 21/743* (2013.01); *H01L 21/761* (2013.01); *H01L 21/76877* (2013.01); *H01L 21/823481* (2013.01); *H01L 29/0649* (2013.01); *H01L 29/0661* (2013.01)

(58) Field of Classification Search
CPC .. H01L 21/7624–76291; H01L 27/1203–1211; H01L 21/76224–76237; H01L 21/823481; H01L 21/823878; H01L 21/76229; H01L 21/743; H01L 21/76877; H01L 21/761; H01L 29/0661; H01L 29/0649
USPC .................................................... 438/424
See application file for complete search history.

(56) References Cited

U.S. PATENT DOCUMENTS

| 6,627,484 B1 | 9/2003 | Ang |
| 7,119,015 B2 | 10/2006 | Park et al. |
| 7,402,487 B2 | 7/2008 | Rennie et al. |
| 7,468,307 B2 | 12/2008 | Hartner et al. |
| 7,723,204 B2 | 5/2010 | Khemka et al. |
| 7,723,800 B2 | 5/2010 | Moens et al. |
| 7,723,818 B2 | 5/2010 | Tilke et al. |
| 7,791,161 B2 | 9/2010 | Zhu et al. |

(Continued)

OTHER PUBLICATIONS

Wang, J.J., "Selective Substrate Contact with Dual Width Trenches", Motorola Technical Developments, vol. 18, pp. 18-21, Mar. 1, 1992.

*Primary Examiner* — Mohammad M Hoque

(57) ABSTRACT

An apparatus includes a first trench formed in a semiconductor layer. The first trench has a first width and a first depth. A second trench is formed in the semiconductor layer. The second trench has a second width and a second depth. The first width is wider than the second width. A buried dielectric layer is disposed between a bottom semiconductor surface of the semiconductor layer and a substrate. The buried dielectric layer contacts a first bottom surface of the first trench. A liner dielectric is formed on the first bottom surface and a first sidewall of the first trench. A first layer is formed on the liner dielectric. A second layer is formed on the first layer and extends to the substrate through an opening formed on the first bottom surface.

7 Claims, 12 Drawing Sheets

(56) References Cited

U.S. PATENT DOCUMENTS

| | | |
|---|---|---|
| 8,258,028 B2 | 9/2012 | Tilke et al. |
| 8,383,488 B2 | 2/2013 | Enichlmair et al. |
| 8,809,994 B2 | 8/2014 | Booth, Jr. et al. |
| 9,601,564 B2 | 3/2017 | Cheng et al. |
| 10,163,680 B1 | 12/2018 | Hu et al. |
| 2004/0018705 A1 | 1/2004 | Colson et al. |
| 2007/0224738 A1* | 9/2007 | Khemka ............... H01L 21/764 438/142 |
| 2008/0012090 A1 | 1/2008 | Meiser et al. |
| 2008/0283960 A1* | 11/2008 | Lerner ............. H01L 21/76229 257/508 |
| 2011/0143519 A1* | 6/2011 | Lerner ............. H01L 21/76264 438/433 |
| 2012/0091593 A1 | 4/2012 | Cheng et al. |
| 2012/0139080 A1* | 6/2012 | Wang ................. H01L 27/1087 257/506 |
| 2016/0233296 A1* | 8/2016 | Cheng ............... H01L 21/76224 |
| 2018/0233514 A1 | 8/2018 | Lee et al. |
| 2018/0358257 A1* | 12/2018 | Enda .................... H01L 21/743 |
| 2020/0176359 A1* | 6/2020 | Chen ................ H01L 21/02532 |

\* cited by examiner

DEEP TRENCH ISOLATION AND SUBSTRATE CONNECTION ON SOI

FIELD

This disclosure relates generally to a Semiconductor-On-Insulator (SOI) device, and more specifically to a deep trench isolation and substrate connection on SOI and methods for manufacturing the same.

BACKGROUND

Deep trench structures in SOI devices have been used to provide high voltage isolation and to make electrical contact to a substrate of the SOI. In some examples, the same trench has been used for both high voltage isolation and for making contact to the substrate. A deep trench relies upon a sidewall dielectric to provide high voltage isolation between adjacent circuit blocks.

Increasing a thickness of the dielectric will improve voltage isolation but at the expense of a narrower conductive plug or a wider trench. Reducing the width of the plug will undesirably increase the resistance of the substrate connection. Alternatively, increasing the width of the trench increases die size area as well as a level of defects due to dislocation faults introduced during formation of the trench.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for independently optimizing a low resistance contact to a substrate or other buried layer, while providing for high voltage isolation. Two separate trenches are formed with different widths with a minimal impact to fabrication process complexity. A wide trench is formed to permit a low resistance contact, while a narrow trench is formed for high voltage isolation and in some embodiments, a contact to a buried layer or well.

First Embodiment

Figure 1:
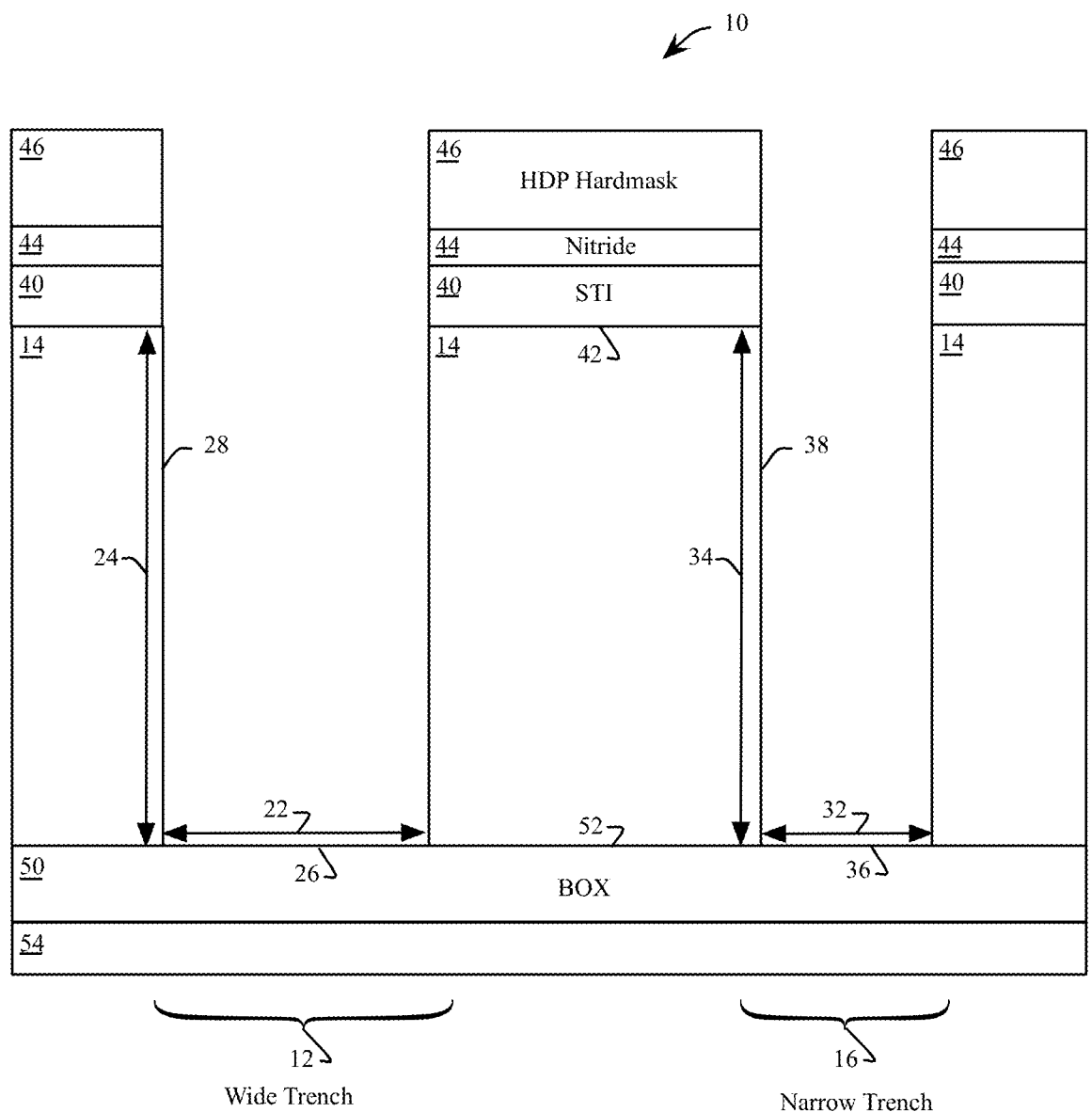
FIG. 1 through FIG. 7 are cross-sectional views of sequential fabrication stages of an SOI device comprising a deep trench isolation and substrate connection, in accordance with a first example embodiment of the present disclosure.

FIG. 1. shows an example embodiment 10 of an initial fabrication step two more trenches having different widths.

In one embodiment, a first (wide) trench 12 is formed in an epitaxial layer 14. In other example embodiments, the epitaxial layer 14 is a semiconductor layer, formed without epitaxial growth. The first trench 12 provides a contact to an SOI substrate, while providing high voltage isolation. It should be understood that references to SOI throughout this disclosure can be replaced with a Silicon-On-Insulator, to form alternate embodiments to those comprising a Semiconductor-On-Insulator. A second (narrow) trench 16 is formed in the epitaxial layer 14. The second trench 16 provides for high voltage isolation in some embodiments, and provides for a contact to a buried layer or well in other embodiments. In some embodiments, the first trench 12 and second trench 16 are formed concurrently, while in other embodiments, the two trenches are formed sequentially. In an embodiment of an SOI that does not require a substrate contact, only the second trench 16 is formed.

The first trench 12 has a first width 22, a first depth 24, a first bottom surface 26 and a first sidewall 28. The second trench 16 has a second width 32, a second depth 34, a second bottom surface 36 and a second sidewall 38. A Shallow Trench Isolation (STI) layer 40 is formed on a top epitaxial surface 42. A Nitride layer 44 is formed on top of the STI 40. A High Density Plasma (HDP) hardmask is formed on top of the Nitride layer 44. An HDP hardmask is a silicon oxide film formed in a high density plasma. It should be understood that references to HDP throughout this disclosure can be replaced with a silicon oxide (or dioxide) film formed with Chemical Vapor Deposition (CVD), to form alternate embodiments. The Nitride layer 44 and the HDP hardmask are used to facilitate the formation of the trenches 12 and 16.

A Buried Oxide (BOX) layer 50 is located between a bottom epitaxial surface 52 and the substrate 54. In the example embodiment 10, the first trench 12 and the second trench 16 are each formed with a timed etch so that the first bottom surface 26 of the first trench 12, and the second bottom surface 36 of the second trench 16 both contact the BOX 50 layer. Hence, the first depth 24 is equal to the second depth 34, within manufacturing tolerances. In the various embodiments described herein, the epitaxial layer 14 is shown above the BOX layer 50 for ease of illustration. More specifically, in various embodiments the silicon closest to the BOX layer 50 is formed from a pulled crystal and is topped-up with epitaxial silicon.

Figure 2:
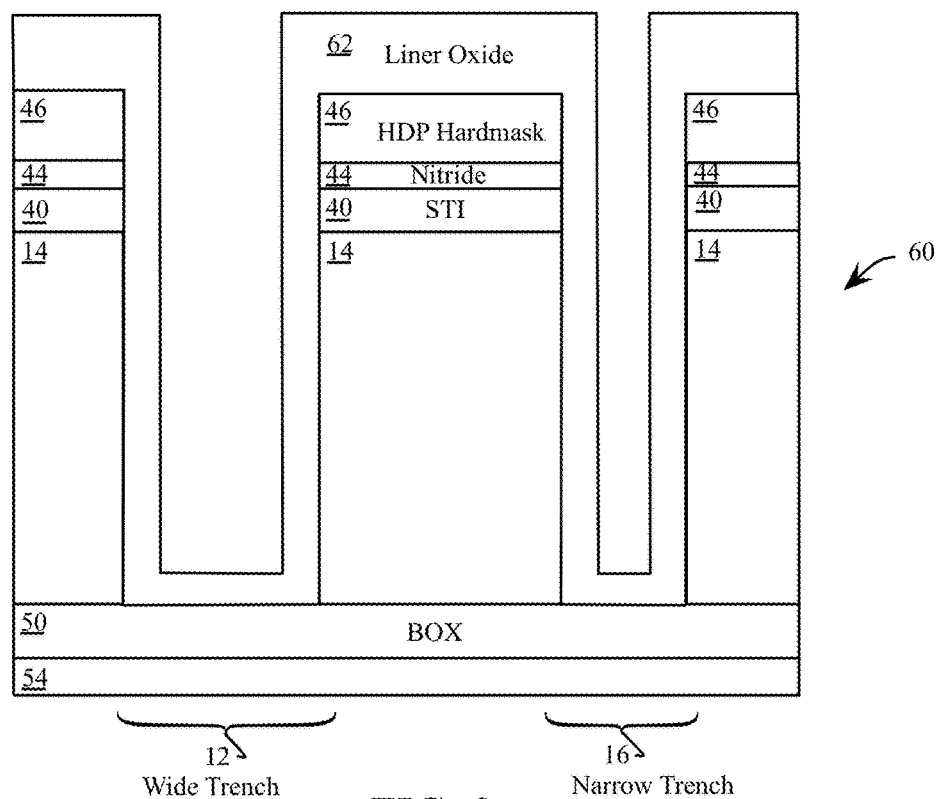
Figure 3:
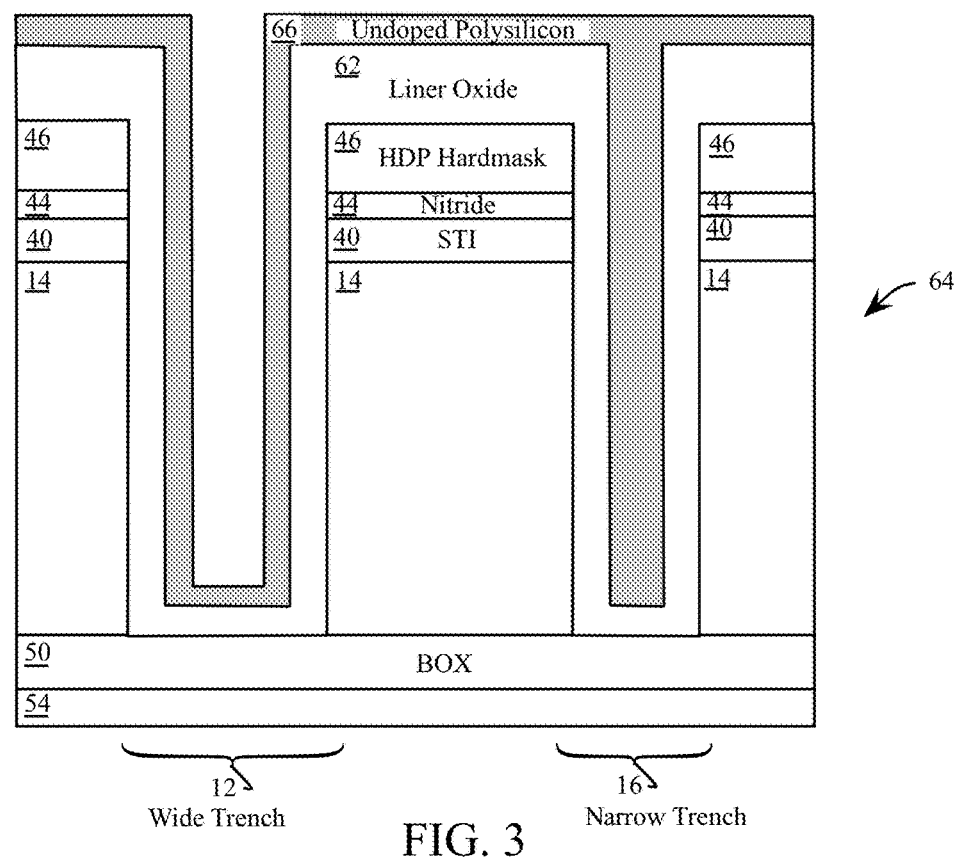

FIG. 2 shows an example embodiment 60 having a subsequent manufacturing step to FIG. 1, wherein a liner oxide 62 is formed in both the first trench 12 and the second trench 16. The liner oxide 62 provides electrical isolation for the trenches 12 and 16. Subsequently, as shown in the example embodiment 64 of FIG. 3, an undoped polysilicon film (or layer) 66 is deposited. The thickness of the polysilicon film is chosen so that the second narrow trench 16 is completely filled, while providing only a lining on the first wider trench 12. It should be understood that references to undoped polysilicon throughout this disclosure can be replaced with undoped amorphous silicon, lightly doped silicon or lightly doped amorphous silicon, to form alternate embodiments. In the embodiment 64, the polysilicon layer 66 is undoped. In another embodiment, the polysilicon layer 66 is doped.

Figure 4:
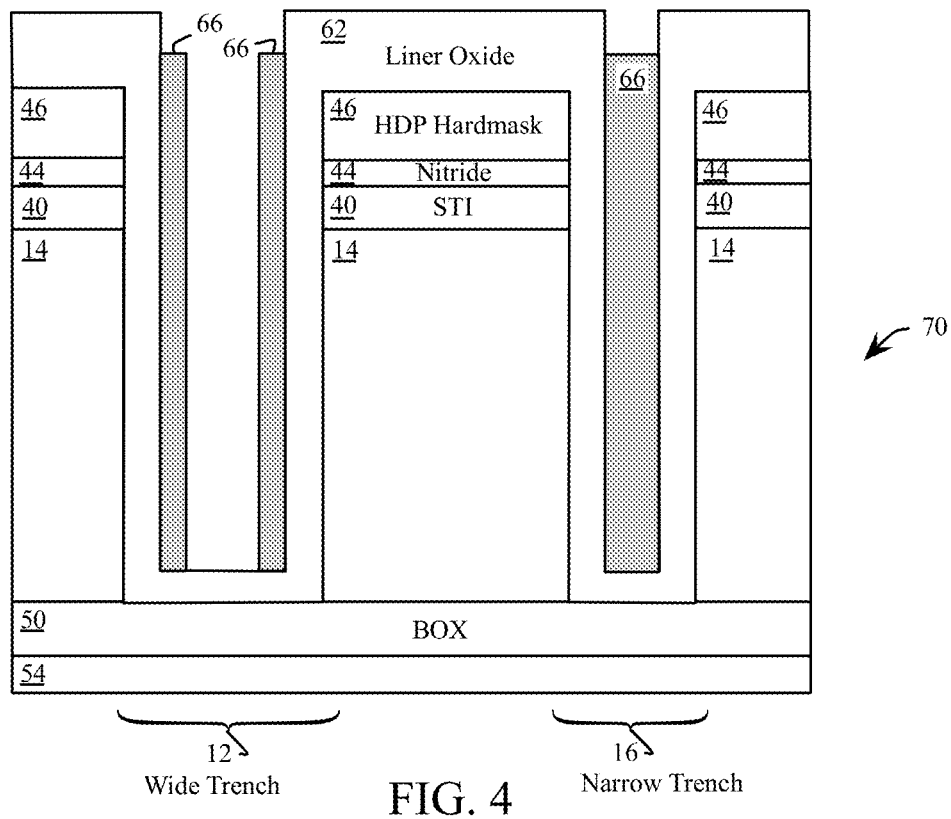
Figure 5:
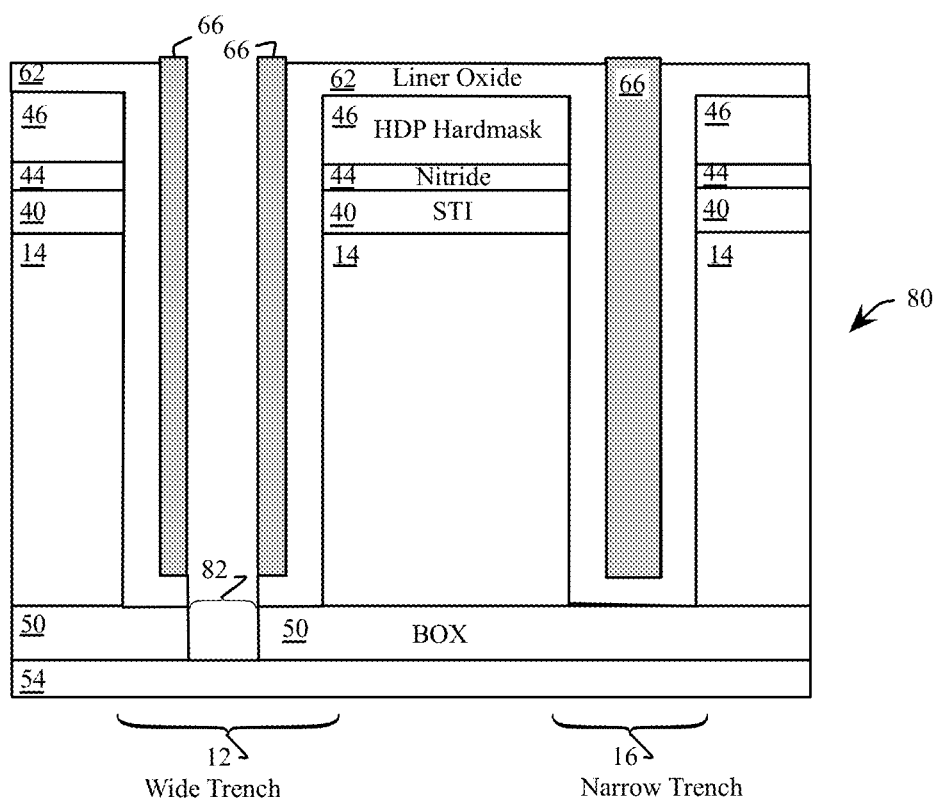
Figure 6:
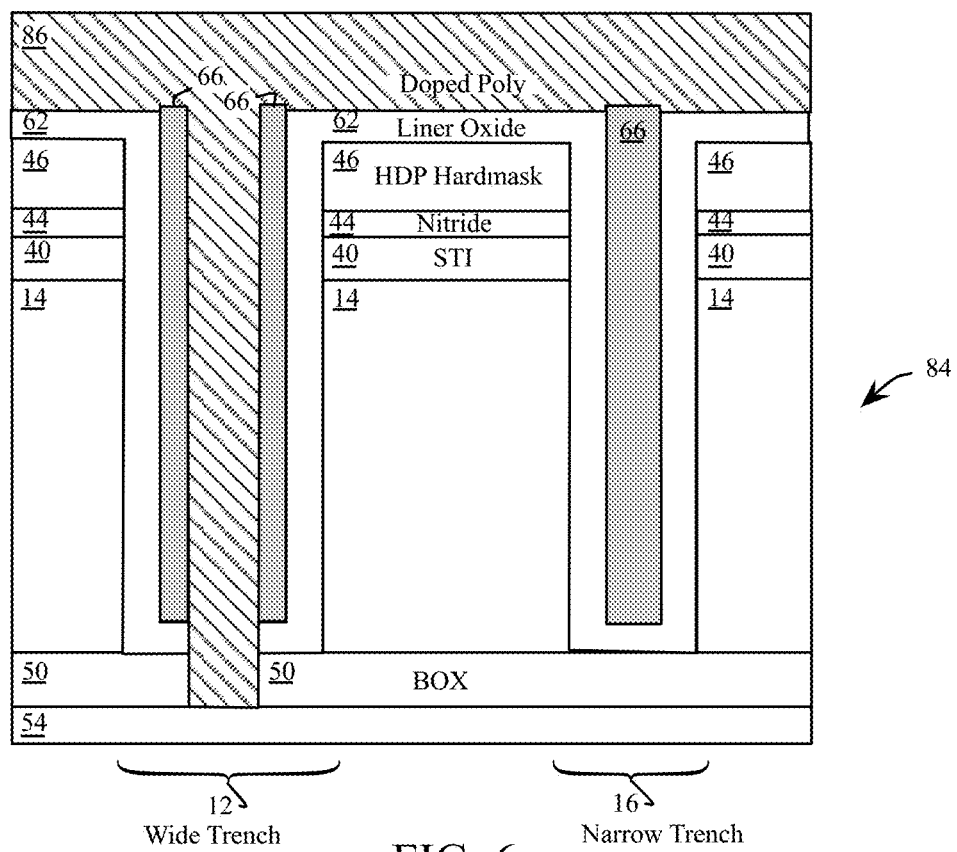
Figure 7:
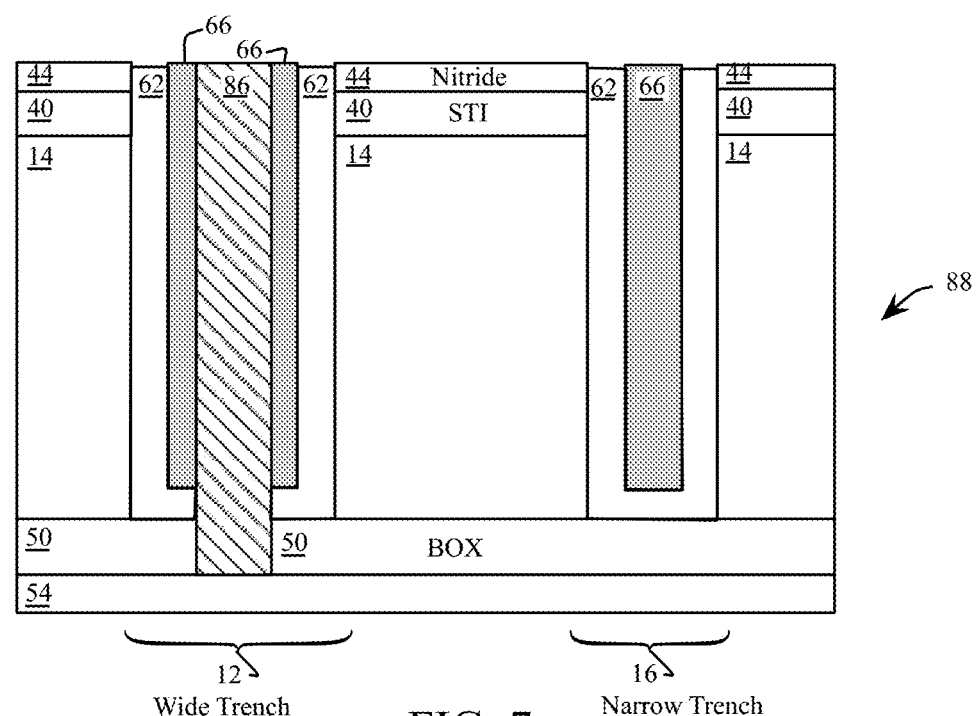

Turning now to FIG. 4, an example embodiment 70 shows the undoped polysilicon layer 66 etched from the wafer surface using an anisotropic Reactive Ion Etch (RIE) process. As shown in FIG. 4, the undoped polysilicon layer 66 is also etched from the base of the first trench 12, at the first bottom surface 26. The undoped polysilicon layer 66 is partially recessed at the top of the second trench 16. FIG. 5 shows an example embodiment 80 wherein an opening 82 is formed between the first trench 12 and the substrate 54. The opening 82 is formed by partially etching the liner oxide 62 and the BOX 50 from the first bottom surface 26 of the first trench 12, using an anisotropic RIE etch. The undoped polysilcon layer 66 in the second trench 16 is not etched by this step. FIG. 6 shows an example embodiment 84 wherein a doped polysilicon film 86 is deposited to fill the first trench 12, and thereby forming a conductive contact with the substrate 54 through the opening 82. The example embodiment 88 of FIG. 7 shows the removal of a surface layer of the doped polysilicon 86, the liner oxide 62 and the HDP hardmask 46, stopping on the nitride layer 44, which acts as a CMP polish stop layer. In one embodiment, a Chemical Mechanical Polish (CMP) is used to remove the surface layers. In another embodiment, a plasma etch is used to remove the surface layers. In one embodiment, a subsequent step is performed on the example embodiment 88 to remove the nitride layer 44 using etching, thereby leaving a low resistance substrate contact in the first trench 12 and a high voltage isolator in the second trench 16. Advantageously, at least two trenches are formed with different widths using the same mask set, wherein one trench contacts a layer underlying the BOX layer 50, while another formed trench does not penetrate the BOX layer 50. In some example embodiments, the various trenches with different widths are etched concurrently.

Second Embodiment

Traditionally, the formation of a contact to a buried conductive layer in a semiconductor device has required a high energy implant. The use of high energy implants requires a limited dosage level of implanted species, thereby undesirably increasing contact resistance to the buried conductive layer. In the following embodiments, the high energy implant resist mask is replaced with an etch mask to create a low resistance doped polysilicon connection to a buried layer or well. The advantages of a low resistance substrate contact and high voltage isolation are maintained. It should be understood that in other embodiments, one or more of the advantages of a low resistance substrate connection, a high voltage isolation and a buried layer (or well) connection are realized. In some embodiments, the trench used for contacting the buried layer (or well) is a different width than the first trench 12 or the second trench 16.

In some embodiments, the formation of the second trench 16 occurs by etching through the STI layer 40. In other embodiments, the formation of the second trench 16 occurs by etching through only a silicon (or epitaxial) layer. However, when etching the trench solely through silicon, it is possible for the second trench 16 not to be etched down to the BOX layer 50, depending upon the width of the second trench 16.

Figure 8:
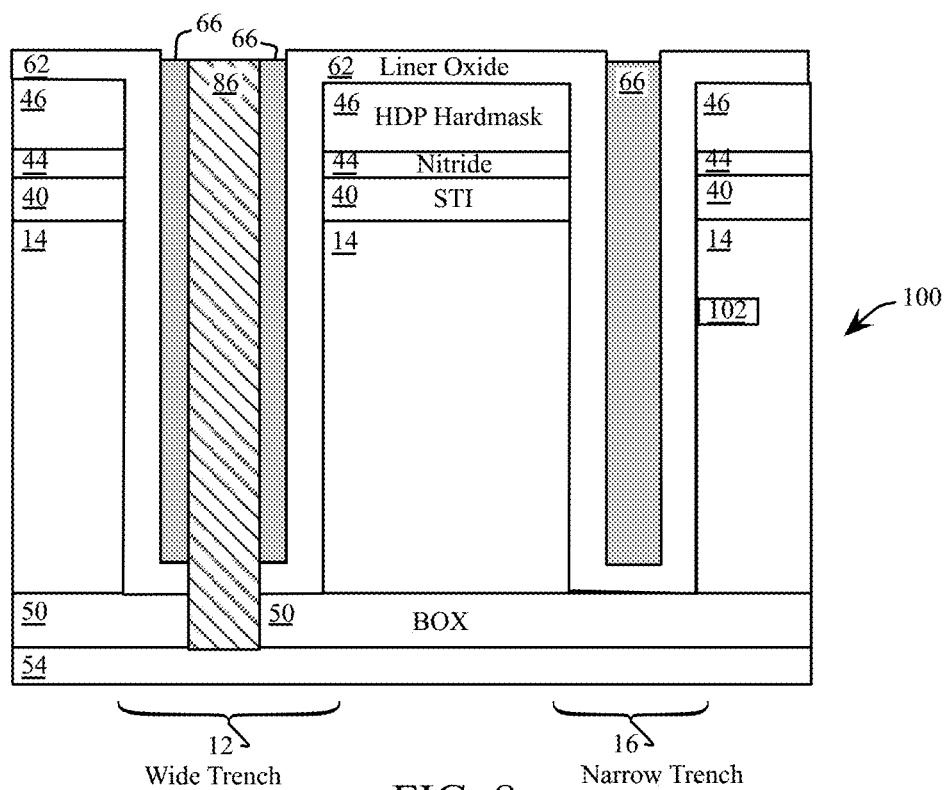
FIG. 8 through FIG. 13 are cross-sectional views of sequential fabrication stages of an SOI device comprising a deep trench isolation and substrate connection, in accordance with a second example embodiment of the present disclosure.

The example embodiment 100 of FIG. 8 shows a subsequent process modification to the embodiment 84 of FIG. 6, and the preceding steps shown in FIGS. 1 through 5. Specifically, the surface layer of the polysilicon 86 is removed by CMP or RIE etch, while leaving the liner oxide 62 and HDP hardmask 46 over the nitride layer 44. In FIG. 8, a buried conductive layer 102 is shown in contact with the sidewall of the second trench 16. For the formation of the embodiment 100 of FIG. 8, the processing steps shown in FIG. 1 through FIG. 6 are modified to include the buried conductive layer 102. In some embodiments, the buried conductive layer 102 contacts one or more sidewall surfaces of the second trench 16, surrounds the second trench 16 or is replaced with a well.

Figure 9:
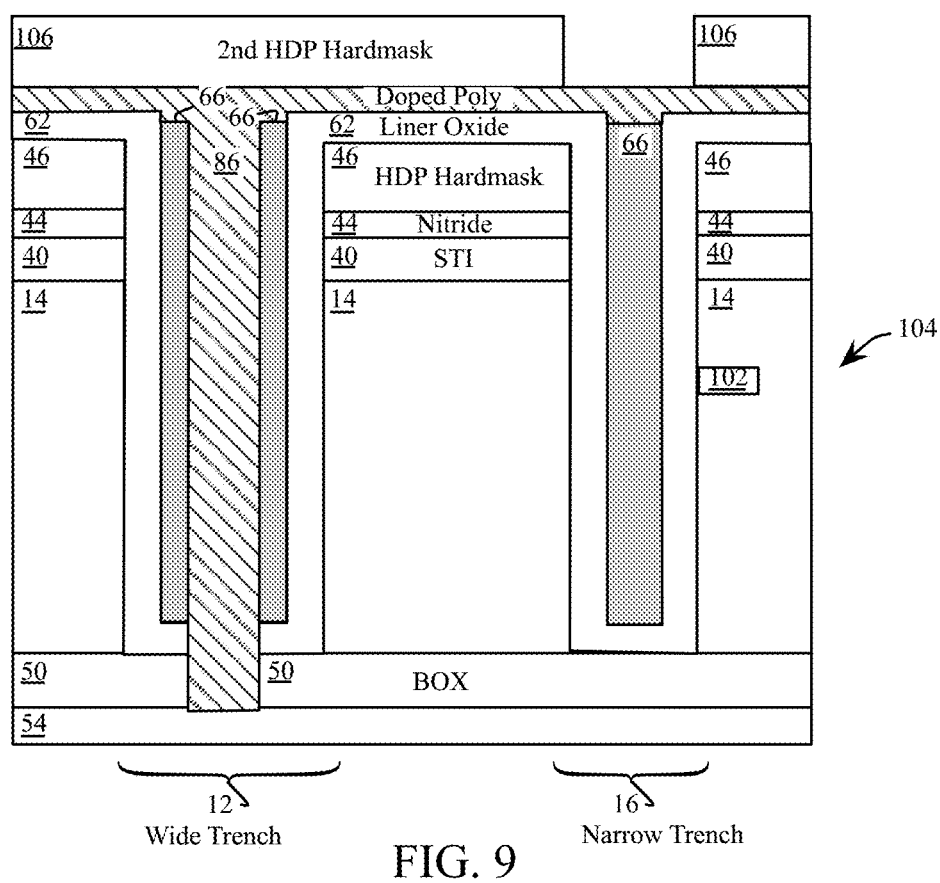
Figure 10:
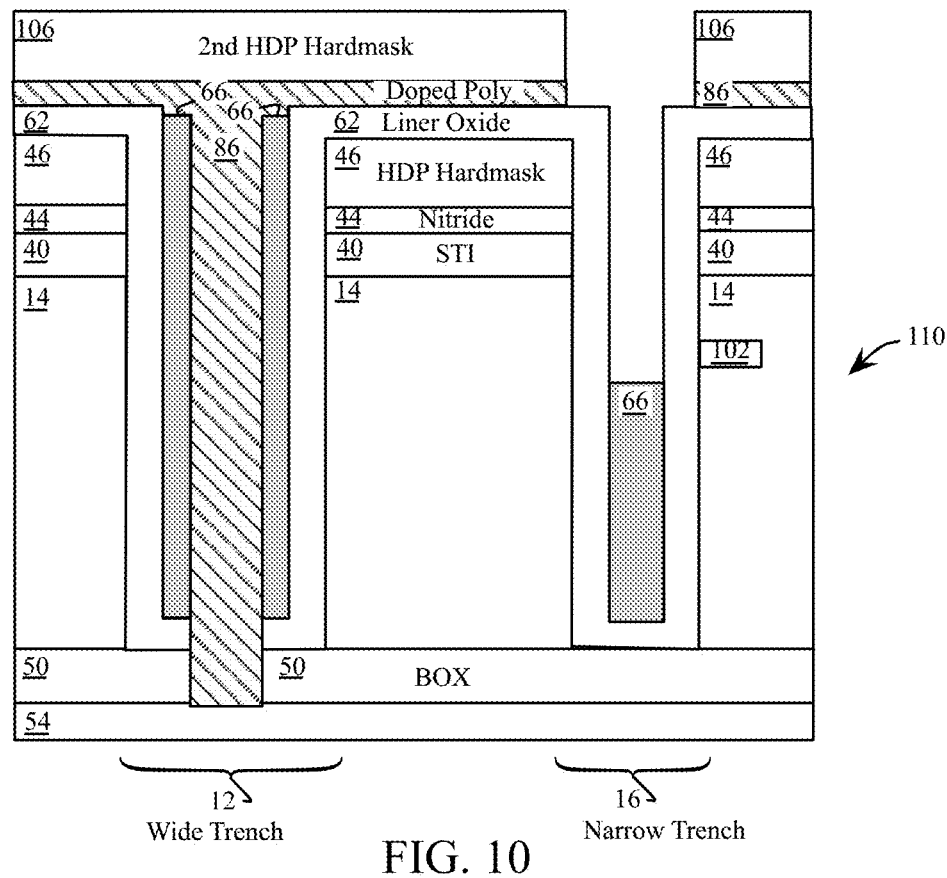
Figure 11:
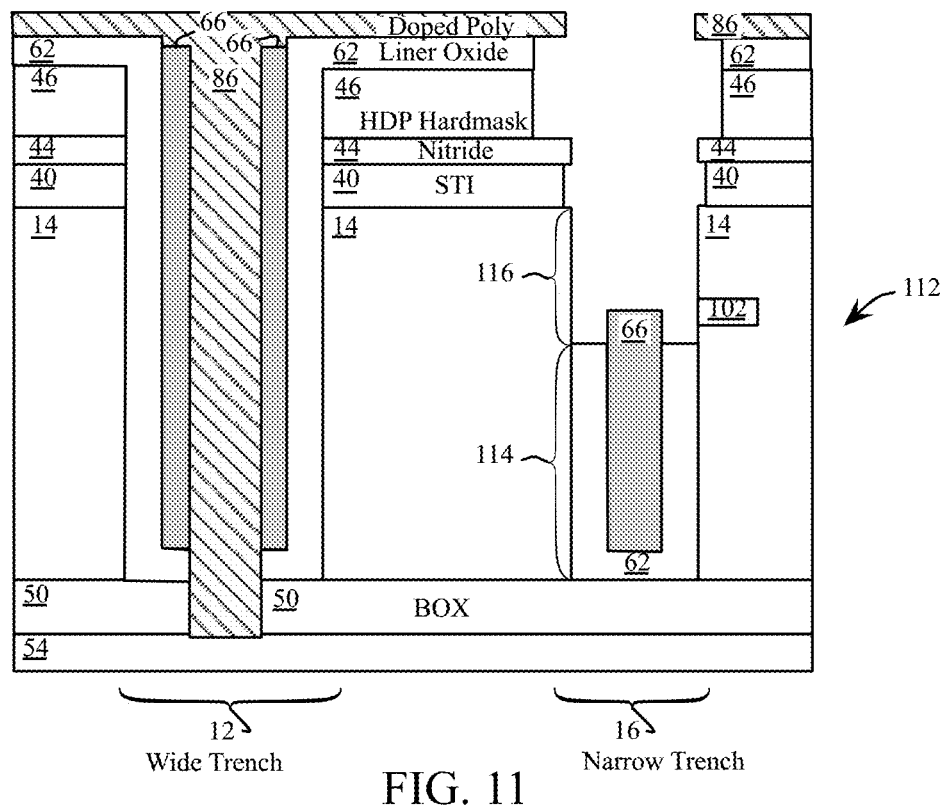

FIG. 9 shows an example embodiment 104 wherein an additional layer of doped polysilicon is added to the existing polysilicon layer 86. In another embodiment, the doped polysilicon layer 86 of FIG. 6 is thinned and the process step shown in FIG. 7 is skipped. A second HDP hardmask 106 is then added to the polysilicon layer 86 and opened over the second trench 16 using a patterned resist layer (not shown). FIG. 10 shown an example embodiment 110 wherein an RIE etch is used to etch through the doped polysilicon 86 and to recess the undoped polysilicon layer 66 within the second trench 16 to a depth at or below the buried conductive layer 102. FIG. 11 shows an example embodiment 112 wherein an isotropic etch is used to remove the liner oxide in the portion of the second trench 16 above the remaining polysilicon 66. The resulting structure of the example embodiment 112 includes first portion 114 of the second sidewall 38, covered by the liner oxide 62, and a second portion 116 of the second sidewall 38.

Figure 12:
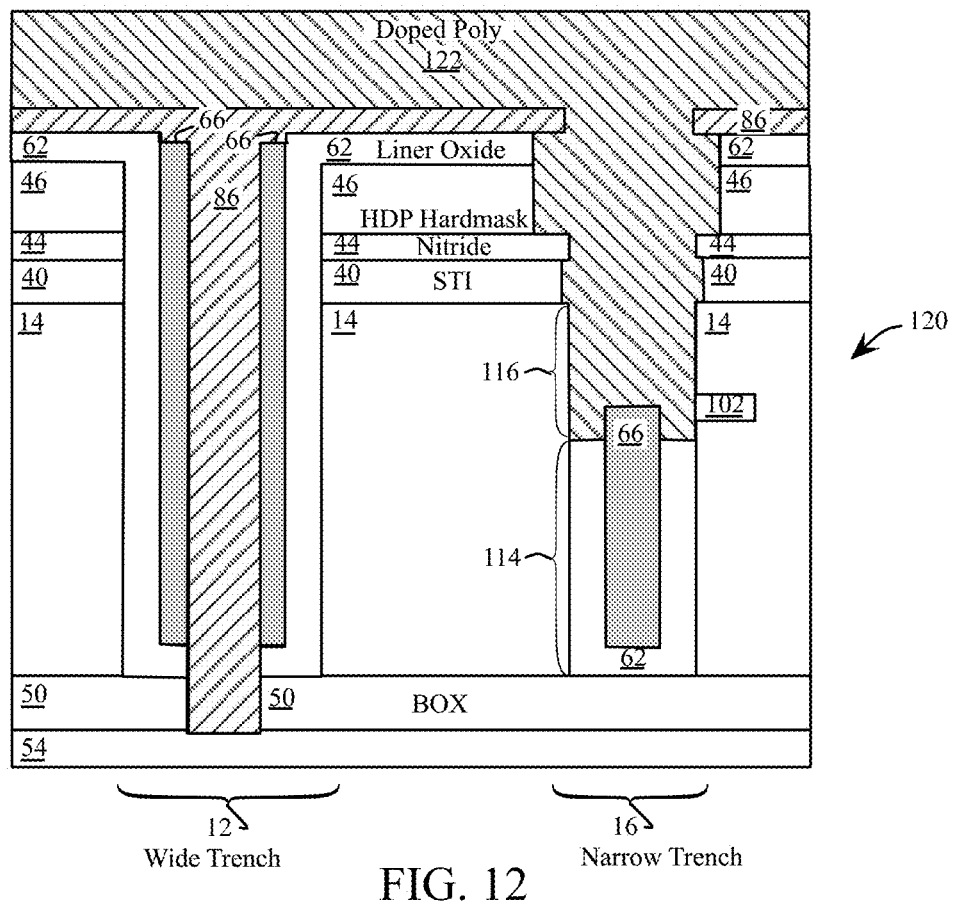
Figure 13:
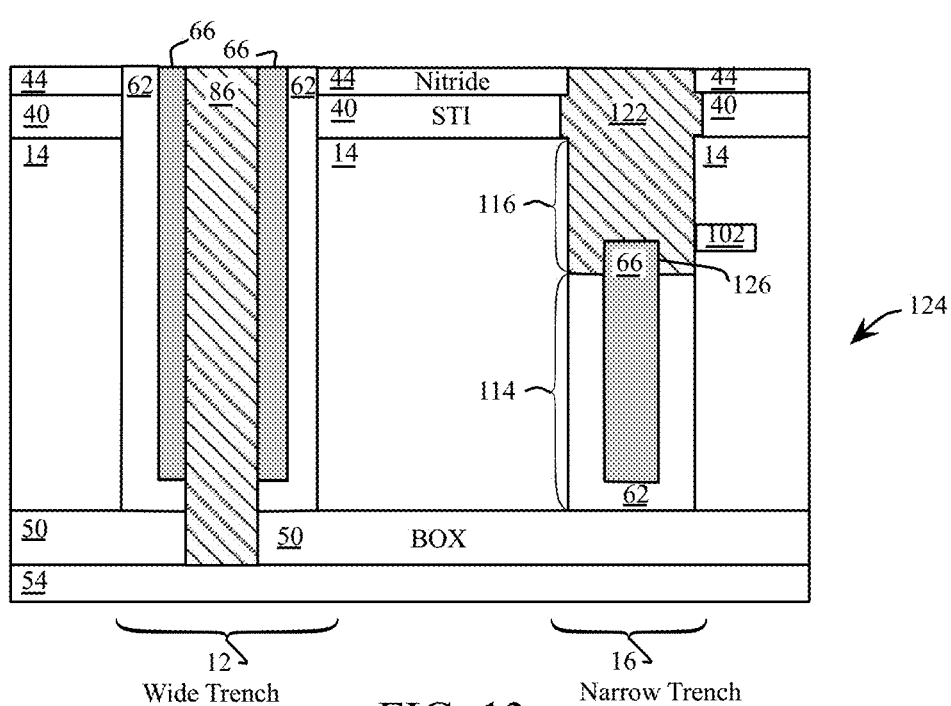

FIG. 12 shows an example embodiment 120 wherein a doped polysilicon layer 122 is deposited over the doped polysilicon layer 86, to fill the second trench 16 and to contact the buried conductive layer 102. In some embodiments, the doped polysilicon layers 86 and 122 have the same dopant type and dopant levels. In another embodiment, the doped polysilicon layer 122 has different dopant characteristics compared to the doped polysilicon layer 86, to engineer a specific contact resistance to the buried conductive layer 102. FIG. 13 shows an example embodiment 124 wherein the surface layer of doped polysilicon 86 and 122, the liner oxide 62 and the HDP hardmask 46 are removed by CMP or a plasma etch. In one embodiment, a side portion 126 of the undoped polysilicon layer 66 contacts the doped polysilicon layer 122. The example embodiment 124 of FIG. 13 provides for a low resistance contact to the substrate 54 in the first trench, and a low resistance, (or engineered resistance), contact to the buried conductive layer 102 in the second trench 16.

In one embodiment, a subsequent step is performed on the example embodiment 88 to remove the nitride layer 44 using etching, thereby leaving a low resistance substrate contact in the first trench 12 and a contact to the buried conductive layer 102 in the second trench 16.

Third Embodiment

Similar to the second embodiment described in FIGS. 8 through 13, a third embodiment enables a deeper contact into the second trench 16 (e.g., closer to the bottom of the trench). In some embodiments, a lower resistance contact is made to the buried conductive layer 102 due to an increase in a contact area between the doped polysilicon 122 and the buried conductive layer 102. It should be understood that in other embodiments, one or more of the advantages of a low resistance substrate connection, a high voltage isolation and a buried layer (or well) connection are realized. In some embodiments, the trench used for contacting the buried layer (or well) is a different width than the first trench 12 or the second trench 16.

Figure 14:
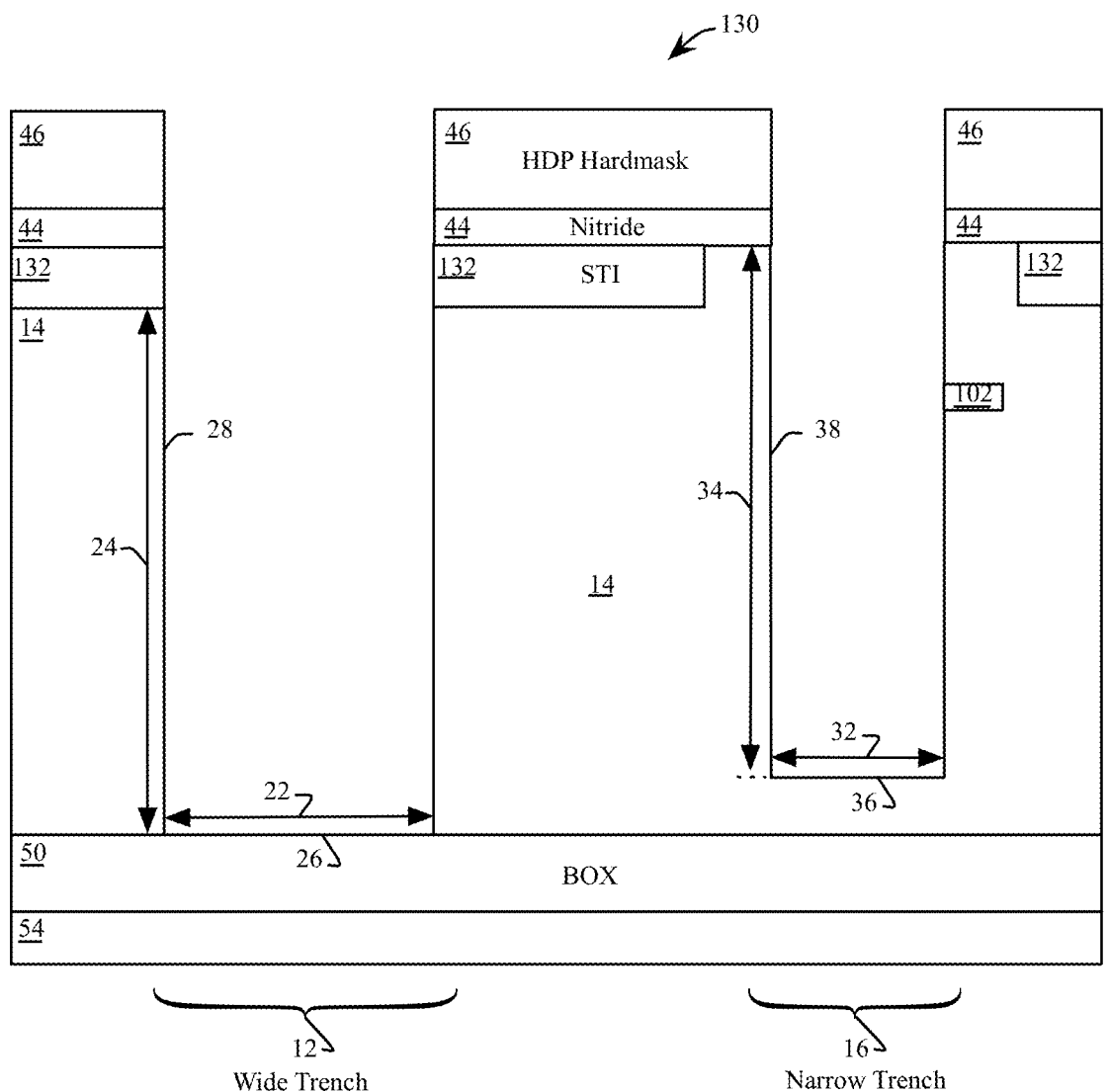
FIG. 14 through FIG. 20 are cross-sectional views of sequential fabrication stages of an SOI device comprising a deep trench isolation and substrate connection, in accordance with a third example embodiment of the present disclosure.

The example embodiment 130 of FIG. 14 differs from the example embodiment 10 of FIG. 1 in that the STI layer 132 does not contact the second trench 16. The example embodiment 130 also includes a buried conductive layer 102 and a second trench 16, which is shallower than the first trench 12. The second width 32 of the second trench 16 is chosen to take advantage of plasma etch lag to ensure that the second trench 16 is not etched down to the BOX layer 50. By etching the second trench 16 though silicon, rather than through the STI 132, the etch depth of the second trench 16 is reduced, hence resulting in a second depth 34 of the second trench 16 being less than the first depth 24 of the first trench 12. As similar process flow as shown in FIGS. 2 through 6 is then followed.

Figure 15:
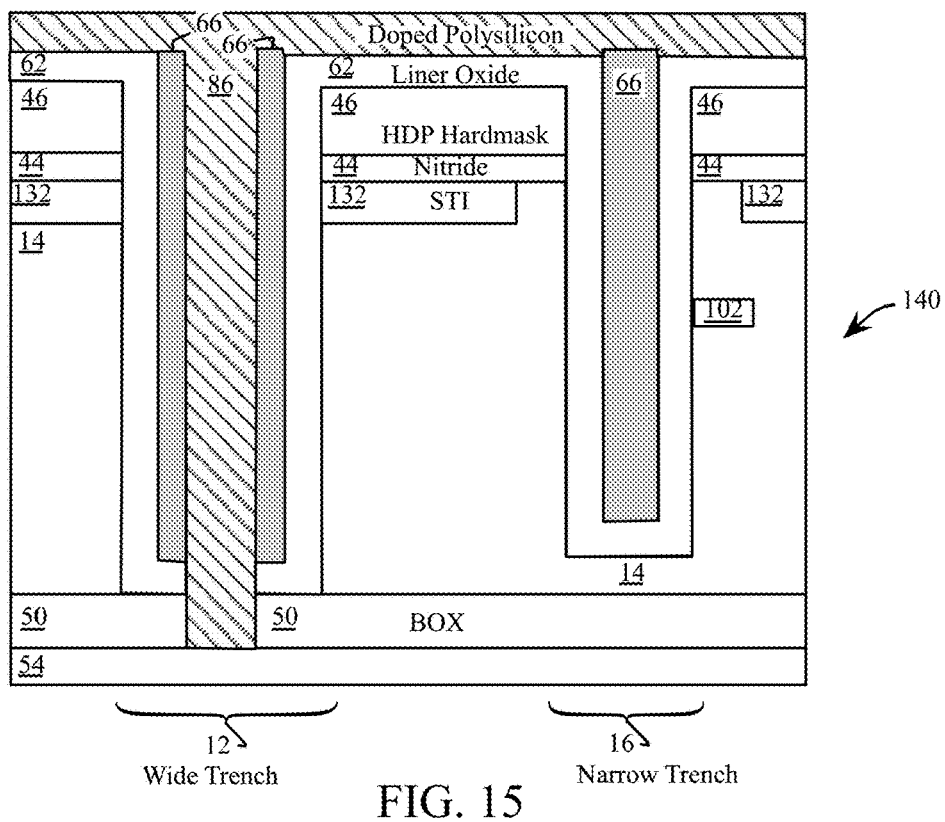
Figure 16:
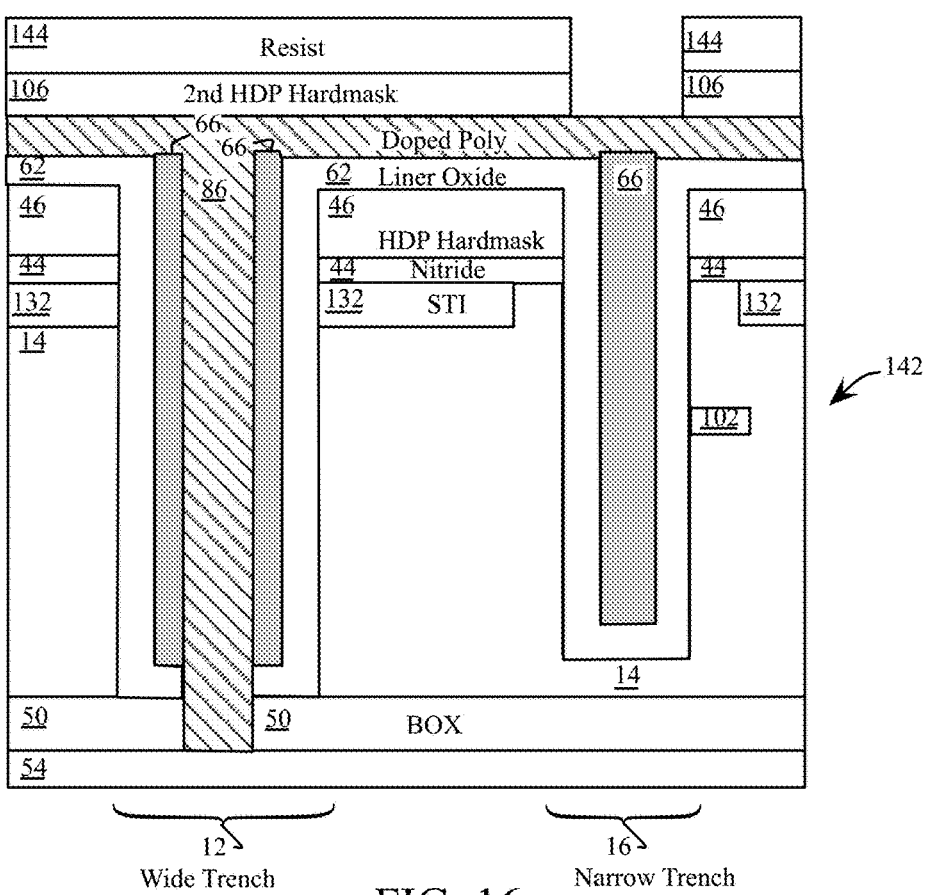
Figure 17:
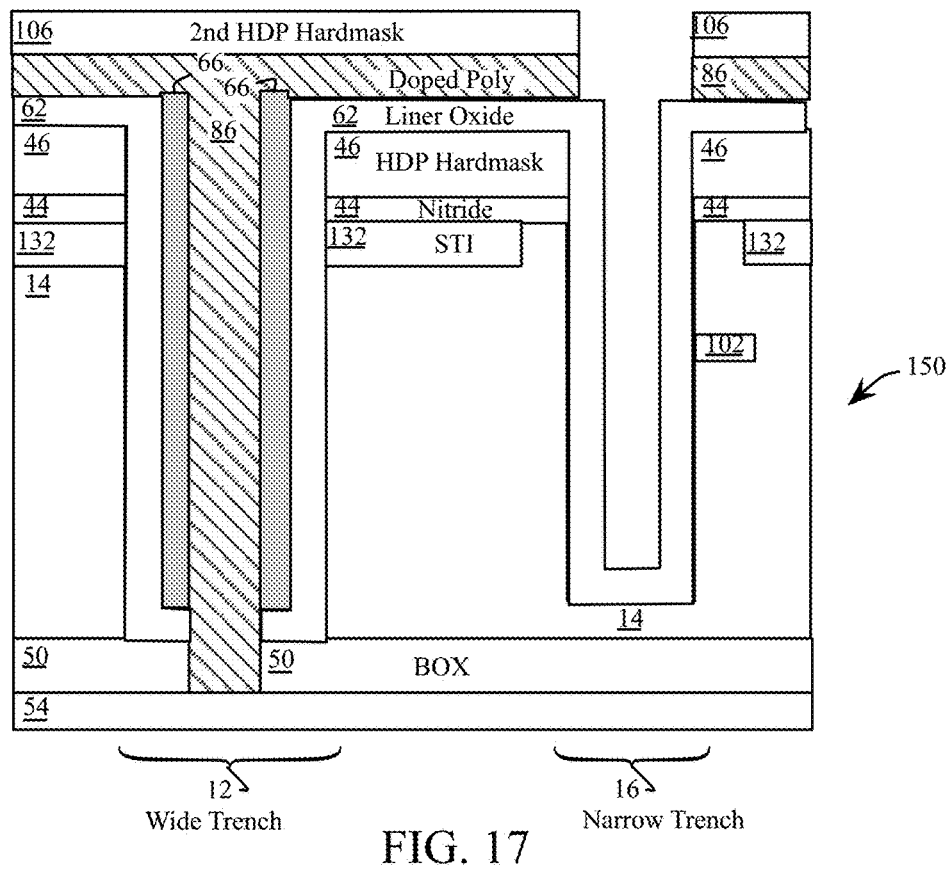
Figure 18:
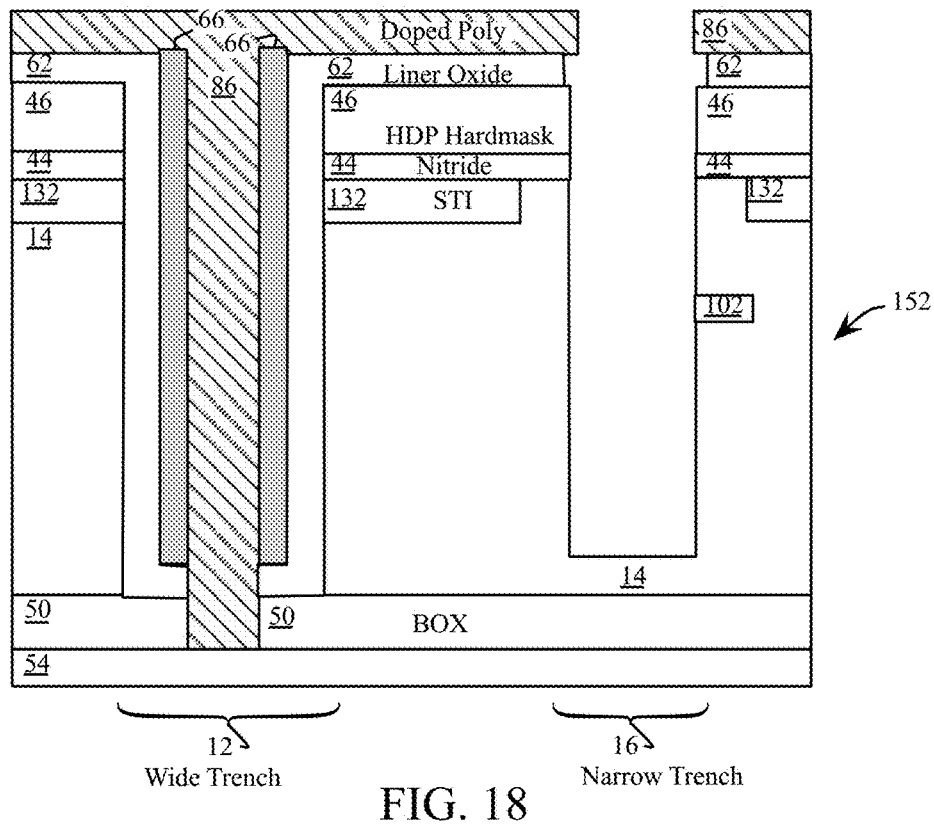

FIG. 15 shows an example embodiment 140, similar to the embodiment 84 of FIG. 6. In the example embodiment 140, the thickness of the doped polysilicon layer 86 is sufficient to close the top of the first trench 12. FIG. 16 shows an example embodiment 142, wherein a second HDP hardmask 46 and patterned resist layer 144 are deposited over the doped polysilicon layer 86. The patterning of the resist layer 144 is used to open the second HDP hardmask 46 over the second trench 16. FIG. 17 shows an example embodiment 150 wherein the resist layer 144 is removed, then a plasma etch is used to open the doped polysilicon layer 86 over the second trench 16 and remove all of the undoped polysilicon 66 from the second trench 16. FIG. 18 shows an example embodiment 152 wherein a wet etch is used to remove second HDP hardmask 106 and the liner oxide 62 in the second trench 16.

Figure 19:
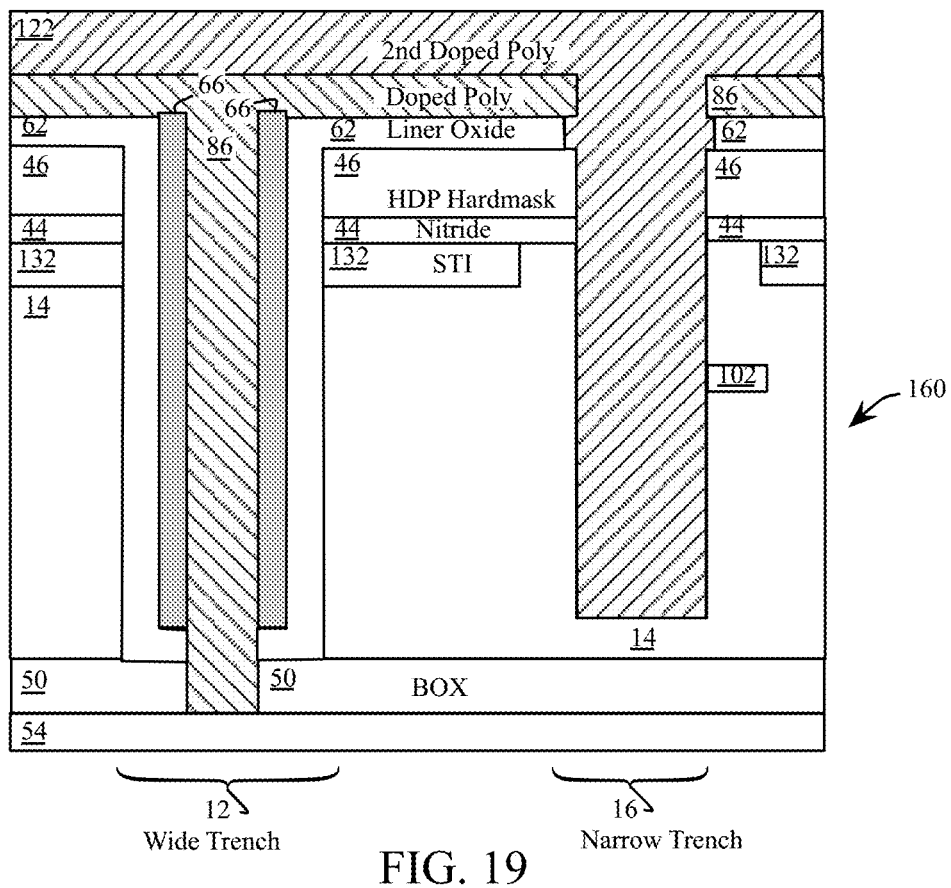
Figure 20:
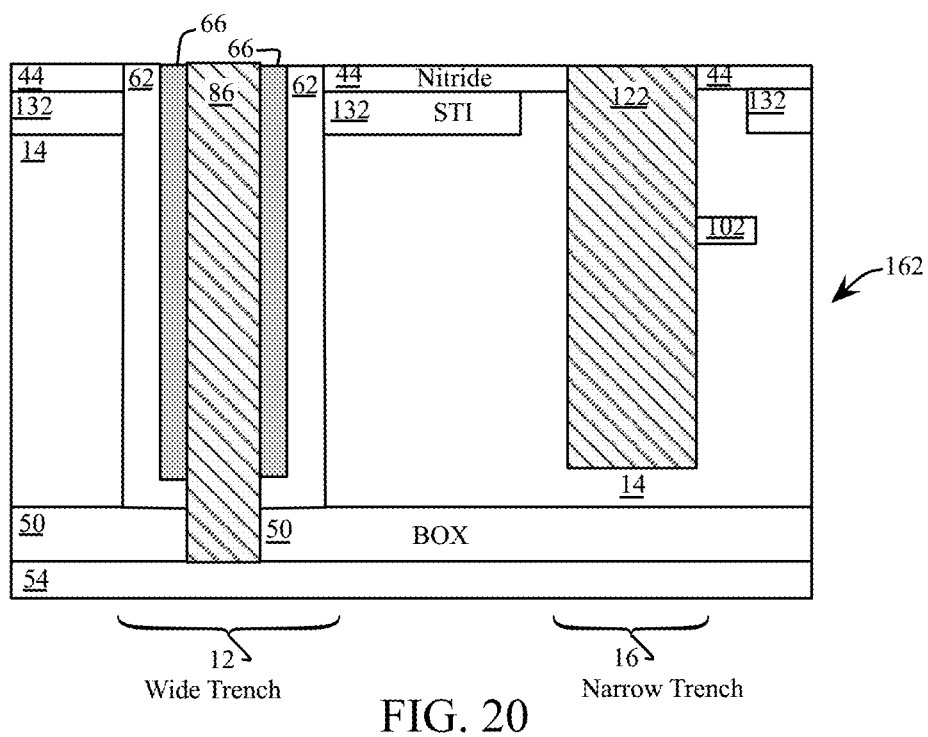

FIG. 19 shows an example embodiment 160 wherein a doped polysilicon layer 122 is deposited over the doped polysilicon layer 86 to fill the second trench 16 and to contact the buried conductive layer 102 (or well). In some embodiments, the doped polysilicon layers 86 and 122 have the same dopant type and dopant levels. In another embodiment, the doped polysilicon layer 122 has different dopant characteristics compared to the doped polysilicon layer 86, to engineer a specific contact resistance to the buried conductive layer 102. FIG. 20 shows an example embodiment 162 wherein the surface layer of doped polysilicon 86 and 122, the liner oxide 62 and the HDP hardmask 46 are removed by CMP, RIE or a combination of CMP and RIE. The example embodiment 162 of FIG. 20 provides for a low resistance contact to the substrate 54 in the first trench, and a low resistance, (or engineered resistance), contact to the buried conductive layer 102 in the second trench 16. Advantageously, trenches of different depths are formed with the same mask. In some example embodiments, openings are formed though a BOX layer 50 with the same mask set as other openings that do not go through the BOX layer 50. In some example embodiments, the various trenches with different widths and/or depths are etched concurrently.

Figure 21:
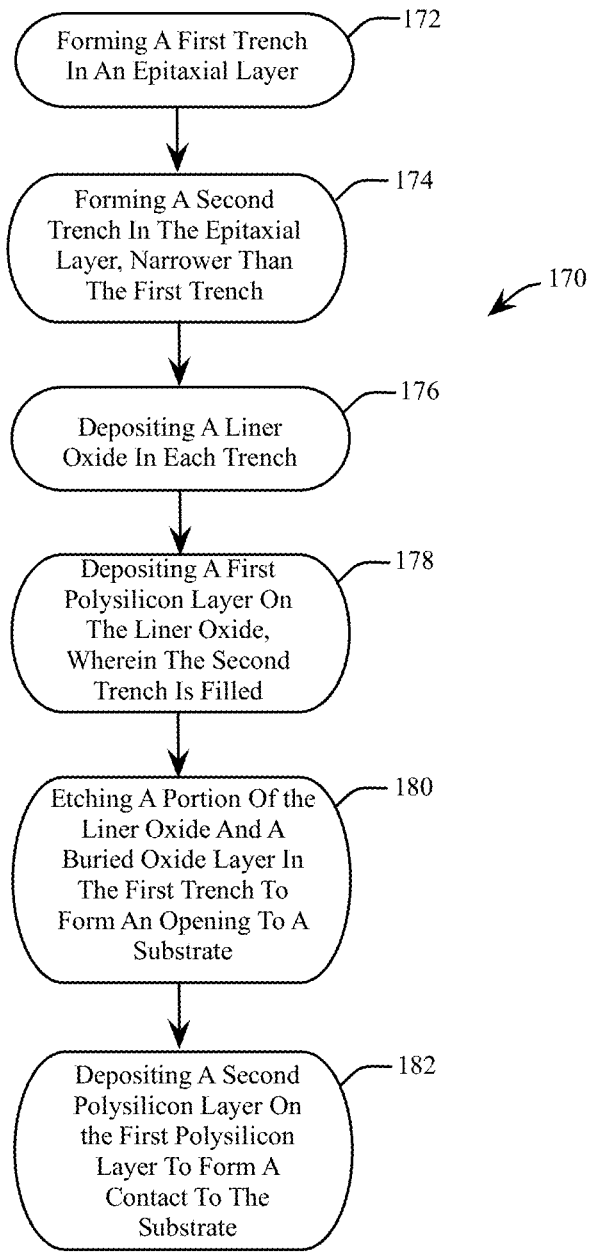
FIG. 21 is a flowchart representation of a method for manufacturing a deep trench isolation and substrate connection on SOI, in accordance with an example embodiment of the present disclosure.

FIG. 21, with reference to FIGS. 1 through 7, shows a method 170 for manufacturing a deep trench isolation and substrate connection on SOI, in accordance with an example embodiment of the present disclosure. At 172, a first trench 12 is formed in an epitaxial layer 14. At 174, a second trench 16 is formed in the epitaxial layer 14. The first trench 12 is narrower than the second trench 16. At 176, a liner oxide 62 is deposited in each trench. At 178, a first polysilicon layer 66 is deposited on the liner oxide 62. The second trench 16 is filled with the first polysilicon layer 66. At 180, a portion of the liner oxide 62 and the BOX 50 in the first trench 12 is etched to form an opening 82 to a substrate 54. At 182, a second polysilicon layer 86 is deposited on the first polysilicon layer 66 to form a contact to the substrate 54.

As will be appreciated, embodiments as disclosed include at least the following. In one embodiment, an apparatus comprises a first trench formed in a semiconductor layer, the first trench comprising a first width and a first depth. A second trench is formed in the semiconductor layer, the second trench comprising a second width and a second depth, wherein the first width is wider than the second width. A buried dielectric layer is disposed between a bottom semiconductor surface of the semiconductor layer and a substrate, the buried oxide layer contacting a first bottom surface of the first trench. A liner dielectric is formed on the first bottom surface and a first sidewall of the first trench. A first layer is formed on the liner dielectric. A second layer is formed on the first layer and extending to the substrate through an opening formed on the first bottom surface.

Alternative embodiments of the apparatus include one of the following features, or any combination thereof. The first depth of the first trench is equal to the second depth of the second trench, the liner dielectric formed on a second bottom surface of the second trench and a second sidewall of the second trench, and the first layer formed on the liner dielectric in the second trench. The second sidewall of the second trench contacts a shallow trench isolation disposed on a top semiconductor surface of the semiconductor layer. The first depth of the first trench is equal to the second depth of the second trench, the liner dielectric formed on a second bottom surface of the second trench and a first portion of a second sidewall of the second trench, the first layer formed on the liner dielectric, and the second layer formed on a second portion of the second sidewall. The second layer contacts a side portion of the first layer. The second depth of the second trench is less than the first depth of the first trench, the second layer formed on a second bottom surface of the second trench and the second sidewall of the second trench, wherein the second bottom surface is separated from the buried dielectric layer by the semiconductor layer. The second sidewall of the second trench is separated from the shallow trench isolation by the semiconductor layer.

In another embodiment, a method for manufacturing a deep trench isolation and substrate connection on Semiconductor-On-Insulator comprises forming a first trench in a semiconductor layer, the first trench comprising a first width and a first depth, wherein a shallow trench isolation is formed on a top semiconductor surface of the semiconductor layer, a buried oxide layer formed between a bottom semiconductor surface of the semiconductor layer and a substrate, and the buried dielectric layer contacting a first bottom surface of the first trench. A second trench is formed in the semiconductor layer, the second trench comprising a second width and a second depth, wherein the first width is wider than the second width. A liner dielectric is deposited in the first trench and the second trench. A first layer is deposited on the liner dielectric, wherein the first layer fills the second trench. A portion of the liner dielectric and the buried dielectric layer is etched from the first bottom surface of the first trench to form an opening on the first bottom surface. A second layer is deposited on the first layer to form a contact to the substrate through the opening.

Alternative embodiments of the method for manufacturing a deep trench isolation and substrate connection on Semiconductor-On-Insulator include one of the following features, or any combination thereof. The first layer is anisotropically etched to expose a top liner surface of the liner dielectric on the first bottom surface of the first trench, wherein the liner dielectric on a second bottom surface of the second trench is not etched. The first trench and the second trench are etched concurrently. Removing a surface layer of the second layer to expose the first layer in the first trench and the second trench. The first depth of the first trench is equal to the second depth of the second trench. The first trench and the second trench are each formed by etching through the shallow trench isolation. A mask is patterned to expose the second trench, wherein the first depth of the first trench is equal to the second depth of the second trench; the first layer is etched to recess the first layer in the second trench to a depth of a buried conductive layer formed in the semiconductor layer; the mask is removed; and a third layer is deposited in the second trench to form a conductive contact to the buried conductive layer. A mask is patterned to expose the second trench, wherein the second depth of the second trench is less than the first depth of the first trench, and a second bottom surface of the second trench is separated from the buried dielectric layer by the semiconductor layer; the first layer is etched to remove the first layer in the second trench; the mask is removed; and a third layer is deposited in the second trench to form a conductive contact to the buried conductive layer formed in the semiconductor layer. The second layer and the third layer are each polysilicon layers doped with a conductive dopant.

In another embodiment, a method for manufacturing a deep trench isolation and substrate connection on Semiconductor-On-Insulator comprises forming a first trench in a semiconductor layer, the first trench comprising a first width and a first depth, a buried dielectric layer formed between a bottom semiconductor surface of the semiconductor layer and a substrate, and the buried dielectric layer contacting a first bottom surface of the first trench. A second trench is formed in the semiconductor layer, the second trench comprising a second width and a second depth, wherein the first width is wider than the second width, and the second depth is less than the first depth. A liner dielectric is deposited in the first trench and the second trench. An undoped first layer is deposited on the liner dielectric, wherein the undoped first layer fills the second trench. A portion of the liner dielectric and the buried dielectric layer is etched from the first bottom surface of the first trench to form an opening on the first bottom surface. A second layer is deposited on the undoped first layer to form a contact to the substrate through the opening.

Alternative embodiments of the method for manufacturing a deep trench isolation and substrate connection on Semiconductor-On-Insulator include one of the following features, or any combination thereof. A mask is patterned to expose the second trench. The undoped first layer is etched to remove the undoped first layer in the second trench. The mask is removed. A third layer is deposited in the second trench to form a conductive contact to a buried layer formed in the semiconductor layer. A shallow trench isolation is formed on a top semiconductor surface of the semiconductor layer, wherein the first trench is formed by etching through the shallow trench isolation and the second trench is formed by etching through a silicon region not comprising the shallow trench isolation. The second layer and the third layer are each polysilicon layers doped with a conductive dopant.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:
   a first trench formed in a semiconductor layer, the first trench comprising a first width and a first depth;
   a second trench formed in the semiconductor layer, the second trench comprising a second width and a second depth, wherein the first width is wider than the second width and the second depth is measured along a first portion of a second sidewall and a second portion of the second sidewall;
   a buried dielectric layer disposed between a bottom semiconductor surface of the semiconductor layer and a substrate, the buried dielectric layer contacting a first bottom surface of the first trench;
   a liner dielectric formed on the first bottom surface, a first sidewall of the first trench, a second bottom surface of the second trench and the first portion of the second sidewall of the second trench, wherein the first portion extends from the second bottom surface of the second trench;
   a first layer formed on the liner dielectric; and
   a second layer formed on the first layer and extending to the substrate through an opening formed on the first bottom surface and the second layer formed on the second portion of the second sidewall, filling the second trench by the second width and spanning the second portion of the second sidewall.

2. The apparatus of claim 1 wherein the first depth of the first trench is equal to the second depth of the second trench, and the first layer formed on the liner dielectric in the second trench.

3. The apparatus of claim 1 wherein the second sidewall of the second trench contacts a shallow trench isolation disposed on a top semiconductor surface of the semiconductor layer.

4. The apparatus of claim 1 wherein the first depth of the first trench is equal to the second depth of the second trench and a buried conductive layer contacts the second portion of the second sidewall.

5. The apparatus of claim 4 wherein the second layer contacts a side portion of the first layer, wherein the first layer extends into the second portion of the second sidewall.

6. The apparatus of claim 1 wherein the second depth of the second trench is less than the first depth of the first trench, the second layer formed on the second bottom surface of the second trench and the second sidewall of the second trench, wherein the second bottom surface is separated from the buried dielectric layer by the semiconductor layer.

7. The apparatus of claim 6 wherein the second sidewall of the second trench is separated from the shallow trench isolation by the semiconductor layer.

* * * * *